(12) United States Patent
Van Herpen et al.

(10) Patent No.: US 8,071,963 B2
(45) Date of Patent: Dec. 6, 2011

(54) DEBRIS MITIGATION SYSTEM AND LITHOGRAPHIC APPARATUS

(75) Inventors: Maarten Marinus Johannes Wilhelmus Van Herpen, Heesch (NL); Derk Jan Wilfred Klunder, Geldrop (NL); Wouter Anthon Soer, Nijmegen (NL); Kurt Gielissen, Meeuwen (BE)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 992 days.

(21) Appl. No.: 11/645,809

(22) Filed: Dec. 27, 2006

(65) Prior Publication Data

US 2008/0157006 A1 Jul. 3, 2008

(51) Int. Cl.
*G21G 5/00* (2006.01)
(52) U.S. Cl. .................. 250/492.2; 250/504 R; 335/219
(58) Field of Classification Search ................ 250/492.2
See application file for complete search history.

(56) References Cited

U.S. PATENT DOCUMENTS

| 6,838,684 | B2  | 1/2005  | Bakker et al. | 250/492.2 |
| 6,972,421 | B2* | 12/2005 | Melnychuk et al. | 250/504 R |
| 7,034,308 | B2  | 4/2006  | Bakker et al. | 250/370.08 |
| 7,164,144 | B2* | 1/2007  | Partlo et al. | 250/504 R |
| 7,251,012 | B2  | 7/2007  | Banine et al. | 355/30 |
| 7,361,918 | B2* | 4/2008  | Akins et al. | 250/504 R |
| 7,696,493 | B2* | 4/2010  | Van Herpen et al. | 250/492.2 |

FOREIGN PATENT DOCUMENTS

| JP | 2005-020006 A | 1/2005 |
| JP | 2005-522839 T | 7/2005 |
| JP | 2003-142296 A | 5/2006 |
| JP | 2007-522646 T | 8/2007 |
| WO | 03/087867 | 10/2003 |

OTHER PUBLICATIONS

Japanese Office Action for Japanese Patent Application No. 2007-328130, mailed on Feb. 1, 2011.

* cited by examiner

*Primary Examiner* — Phillip A Johnston
(74) *Attorney, Agent, or Firm* — Pillsbury Winthrop Shaw Pittman LLP

(57) ABSTRACT

A debris mitigation system for trapping contaminant material coming from a debris-generating radiation source. The system includes a contamination barrier constructed and arranged to rotate about an axis, and a magnet structure constructed and arranged to provide a magnetic field for deflecting charged debris from the radiation source. The magnet structure is constructed and arranged to provide a magnetic field through the contamination barrier. The magnetic field, when passing through the contamination barrier, is oriented along planes generally coinciding with the axis of rotation of the contamination barrier.

19 Claims, 8 Drawing Sheets

DEBRIS MITIGATION SYSTEM AND LITHOGRAPHIC APPARATUS

FIELD

The present invention generally relates to a debris mitigation system and a lithographic apparatus that includes the debris mitigation system. More specifically, the invention relates to a debris mitigation system for trapping contaminant material coming from a debris-generating radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to EUV radiation, radiation sources used in EUV lithography tend to generate contaminant material that may be harmful for the optics and the working environment in which the lithographic process is carried out. Hence, in EUV lithography, a desire exists to limit the contamination of the optical system that is arranged to condition the beams of radiation coming from an EUV source. To this end, it is known to use a so-called rotating foil trap, for instance, as disclosed in U.S. Pat. No. 6,838,684. A typical foil trap uses a high number of closely packed foils that are aligned generally parallel to the direction of the radiation generated by the EUV source. Contaminant debris, such as micro-particles, nano-particles and ions can be trapped in walls provided by foil plates. Thus, the foil trap may function as a contamination barrier that traps contaminant material from the source. Generally, these foil traps are designed to have a sufficiently large dimension to trap virtually any contaminant particle traveling through the trap. Indeed, a large fraction of debris is captured since the velocity directions are mostly non-parallel to the foil plates so that impact of the contaminant material follows eventually. Also, smaller particles travel in typical random diffusion-like paths in which most of the particles are trapped eventually. However, a small fraction of particles travel in a direction and at a velocity that allows the particles to travel through the foil trap, which may cause undesired contamination of the optics. These are mostly micro and nanometer sized particles traveling at speeds <1000 m/s. Such particles may be stopped using a rotating foil trap. However, some of these particles have a velocity that is too high to be stopped by the rotating foil trap (typically this is the case for nanometer sized particles and for ions/fast neutrals). To improve the debris mitigating function of the foil trap, electromagnetic deflecting fields have been proposed.

However, a rotating foil trap functions as a rotor in a static electromagnetic field, which may impede the function thereof and cause undesired inhibiting of the foil trap rotation.

SUMMARY

It is an aspect of the present invention to reduce the inhibiting effect of an electromagnetic field while improving the debris mitigating effect of the rotating foil trap.

According to an embodiment of the invention, a debris mitigation system for trapping contaminant material coming from a debris-generating radiation source is provided. The system includes a contamination barrier constructed and arranged to rotate about an axis, and a magnet structure constructed and arranged to provide a magnetic field for deflecting charged debris from the radiation source. The magnet structure is constructed and arranged to provide a magnetic field through the contamination barrier. The magnetic field, when passing through the contamination barrier, is oriented along planes generally coinciding with the axis of rotation of the contamination barrier.

According to an embodiment of the invention, a lithographic apparatus is provided. The apparatus includes a patterning device constructed and arranged to pattern a beam of radiation, a projection system constructed and arranged to project the patterned beam of radiation onto a substrate, and a debris mitigation system constructed and arranged to trap contaminant material generated by a debris-generating radiation source. The debris mitigation system includes a contamination barrier constructed and arranged to rotate about an axis, and a magnet structure constructed and arranged to provide a magnetic field for deflecting charged debris from the radiation source. The magnet structure is constructed and arranged to provide a magnetic field through the contamination barrier. The magnetic field, when passing through the contamination barrier, is oriented along planes generally coinciding with the axis of rotation of the contamination barrier.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
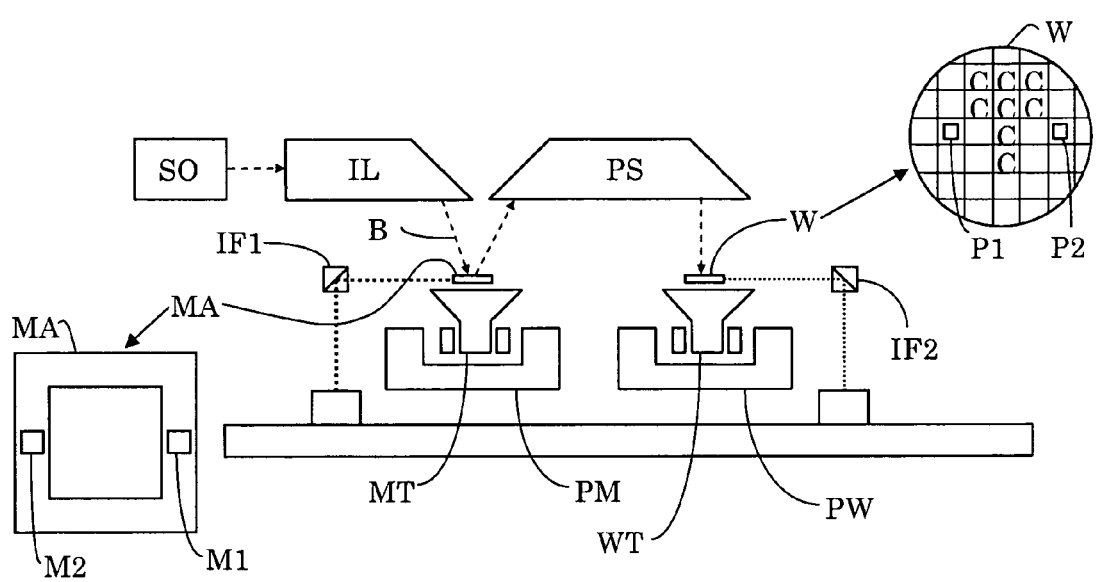
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if needed, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
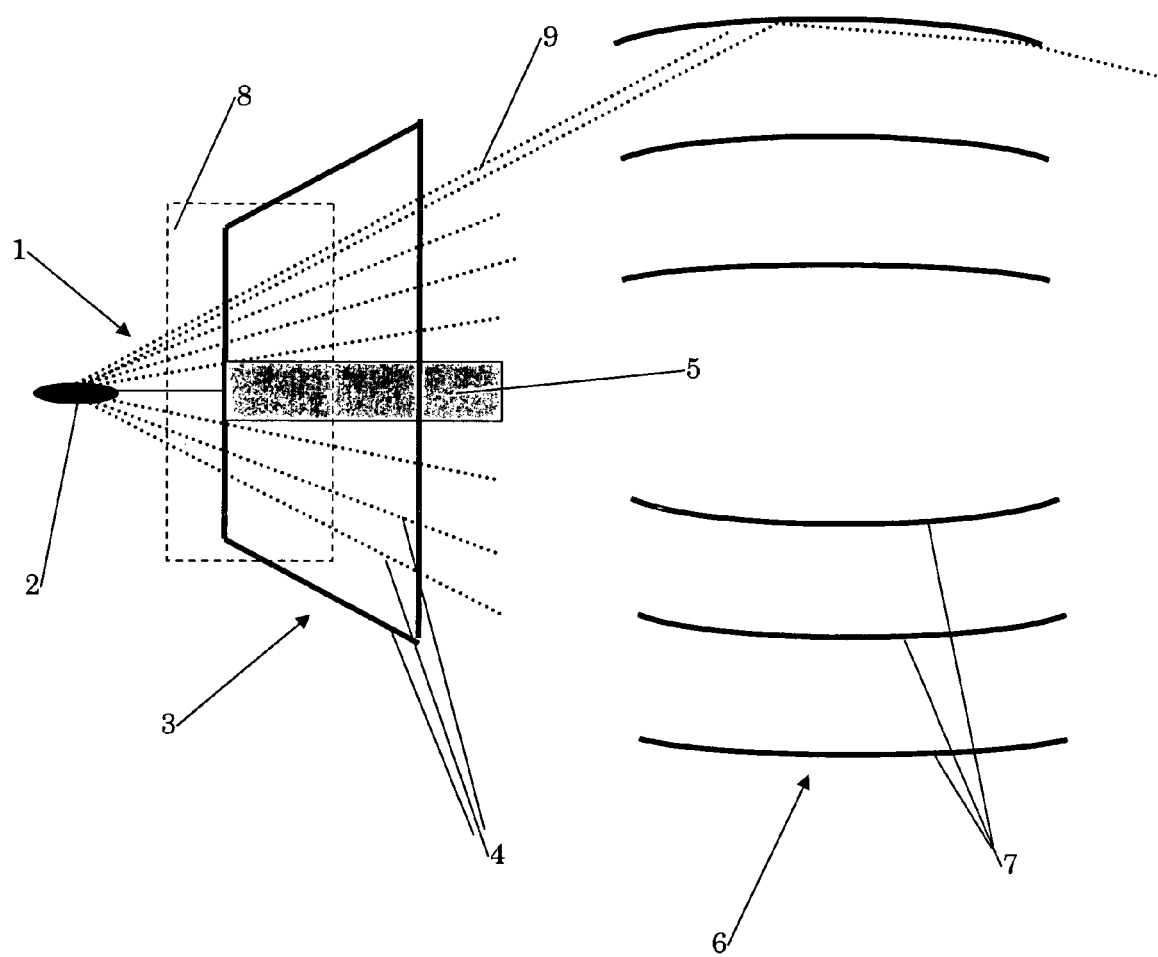
FIG. 2 depicts a first embodiment of the invention.

FIG. 2 shows a basic configuration for a radiation system according to embodiments of the invention. In the Figure, the dashed lines represent EUV radiation 1 coming from an EUV source 2, which may be a discharge produced or a laser induced plasma source such as a tin, lithium or xenon source, which are known per se. The foil trap 3 functions as a contamination barrier for trapping contaminant material coming from the radiation source 2. To this end, the foil trap 3 is provided with a plurality of closely packed foil plates 4, typically about 100 arranged at a distance of about 0.3-5 mm (depending on radial distance). The foil plates 4 may have a length dimension in substantially the radial direction from the source 2 of about a few cm, for example. Preferably, the foil plates 4 lengths ranging from about 1.5-5 cm. Along a central axis, the source 2 may be shielded by a heat shield 5.

The foil trap, also referenced as a contamination barrier, comprises a plurality of foil plates 4 positioned in respective planes which are parallel to a propagation direction of radiation 9.

As is schematically indicated in FIG. 2, in the downstream direction of the radiation, a collector element 6 is present and has a converging power for collecting and converging the EUV radiation from the EUV source 2 to further EUV optics. Such a collector element 6 may generally be cylinder symmetric along a central axial direction and comprises concentrically curved shell formed reflective surfaces 7 that are stacked at a distance ranging between about 1 and 7 cm. As illustrated in FIG. 2, a magnetic field 8 may be arranged in the area between the source 2 and a foil trap 3. The magnetic field 8 may function to deflect charged particles from a trajectory that would leave the particles unhindered through the foil trap 3. However, when rotating the foil trap 3 through the magnetic field 8, the flux of magnetic field lines on the platelets 4 will change. As a result, a current may be induced, which in turn will induce a magnetic field that results in a force opposite to the force driving the foil trap 3. This may make it difficult to rotate the foil trap 3 at the desired speed.

According to an aspect of the invention, a magnet structure is used to provide the magnetic field 8 through the contamination barrier 3. When passing through the contamination barrier 3 (see FIG. 3), the magnet field is oriented along planes generally coinciding with the axis of rotation 10 of the foil trap 3. Although the foil trap 3 can have any form and a magnetic flux through the foil trap 3 can be defined as a sum of fluxes passing through all constituent parts of the foil trap, in the embodiment of FIG. 2, the plates 4 are preferably oriented parallel to the magnetic field 8. In this respect, the magnetic field 8 is created so that magnetic field lines traverse the plates 4 in an axial direction, relative to the axis of rotation of the foil trap 3. In another respect, the magnetic field 8 may be provided to have magnetic field lines traversing the plates 4 in a radial direction, relative to the axis of rotation.

According to another aspect of the invention, an outer magnet structure 11 is arranged providing a passage to the radiation, in addition to provide a magnetic field 8 for deflecting charged debris. The magnet structure 11 is preferably arranged to provide a magnetic field having a symmetry axis generally coinciding with the axis of rotation. In particular, the symmetry can be rotational symmetry about the symmetry axis and/or reflection symmetry in one or more planes passing through the symmetry axis. Preferably, the magnetic field 8 is provided generally invariant for a rotation of the rotating contamination barrier, that is, a rotation, less than 360° over a specified number of angles. More preferably, the magnetic field is provided generally invariant for any rotation angle of the rotating contamination barrier. In addition, another debris mitigation system may be present in this area between the source 2 and the foil trap 3, or between foil trap 3 and collector 6, for instance, using a buffer gas for thermalizing the ions coming from the EUV source. Then, the ions may be stopped by a stationary foil trap, in the same way as normal atomic debris is stopped. The magnetic field may rotate along with the foil trap 3 or may be stationary relative to that trap 3.

Figure 3:
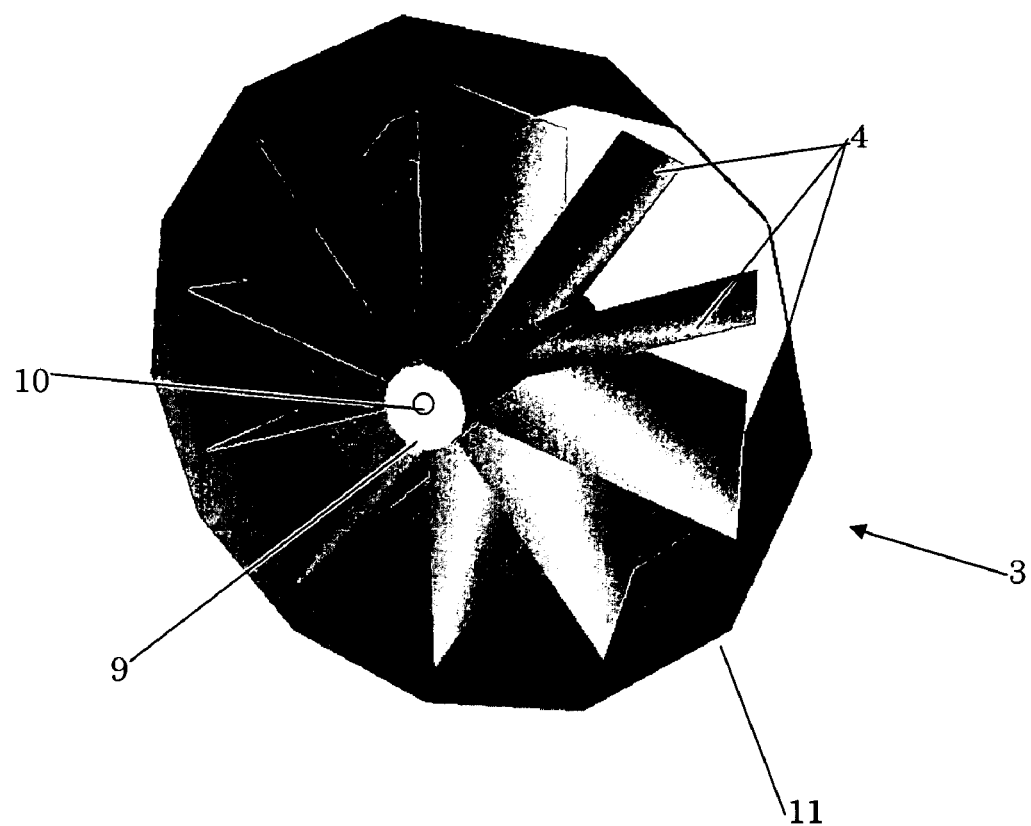
FIG. 3 shows a further detailing of the magnetic structure for the magnetic field shown in FIG. 2.

FIG. 3 shows a further detailing of the magnetic structure 9, 11 for the magnetic field 8 shown in FIG. 2. The embodiment uses an outer magnet structure 11 and a central magnet structure 9 opposed relative to each other to provide a generally radially oriented magnetic field. In the current example, the outer magnet structure 11 is a hollow structure comprising axially opposed magnetic poles, that is, having a magnetic axis substantially parallel to the axis of rotation 10. A central magnet structure 9 is provided having magnetic poles for providing a magnetic axis generally parallel to the rotation axis 10, and having poles opposite to the poles of the hollow structure. Accordingly, at least on the axial outer ends of the magnetic structure, a generally radially oriented magnetic field is provided. The first magnet structure 9 is incorporated into the rotation axis 10 of the foil trap 3 and therefore it will rotate along with the foil trap 3. It should be noted that it is also possible to keep the magnet 9 stationary, and have a rotating foil trap 3 surrounding the axial magnet. The advantage of this is that it may be easier to equip the magnet with cooling. For the same reason, the magnet structure 9 is preferably stationary, but it may also be incorporated into the rotating part of the rotating foil trap 3, for example, to increase the structural strength. The second magnet structure 11 may be placed at a distance from the foil trap 3, but surrounding it and causing magnetic field lines to run in radial directions.

Figure 4:
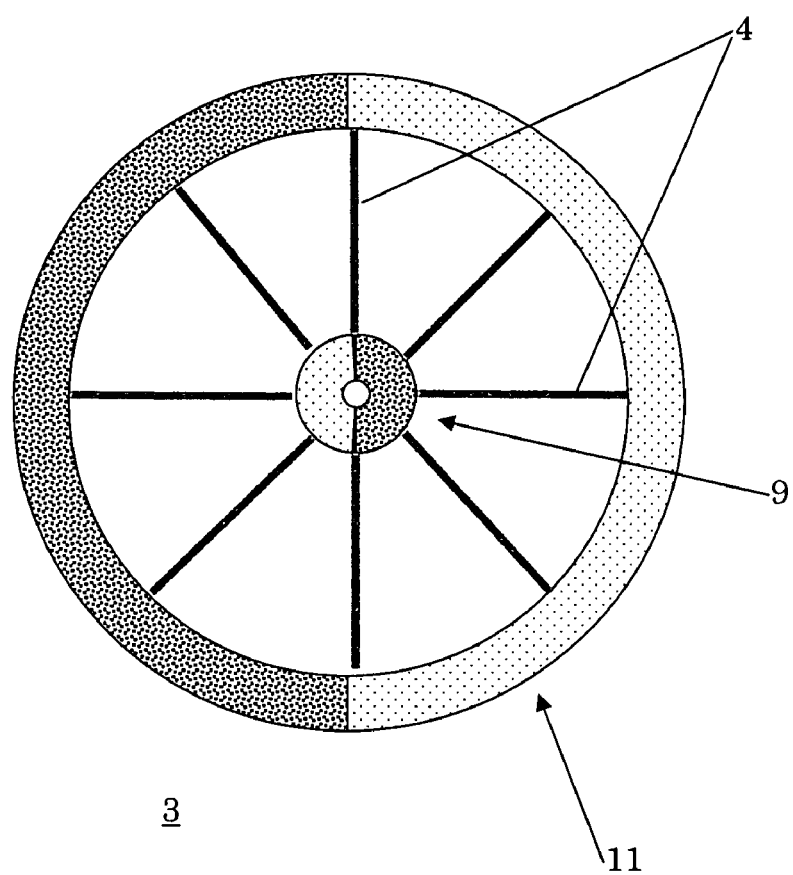
FIG. 4 shows a cross-sectional view, in the viewing direction of the rotation axis.

FIG. 4 shows a cross-sectional view, in the viewing direction of the rotation axis, for an alternative embodiment. Here, the magnetic field is not fully rotation symmetric, but the magnetic field is provided generally invariant for a rotation of the rotating contamination barrier over an angle of 180°. The magnetic structure comprises an outer hollow magnet structure 11 that comprise semicircular radially opposed poles, and a central magnet structure 9 is provided that comprises radially opposed magnetic poles opposite to the poles of the hollow structure 11. The outer structure 11 is preferably an integral structure of radially aligned oppositely arranged curved magnetic structures 10 and 11 to produce a magnetic field that is radially aligned relative to the central axis of rotation. Due to limited rotational symmetry of the magnetic field, components surrounding the rotating foil trap may to some extent be exposed to a varying magnetic field, if the magnetic structures 10 and 11 rotate along with the foil trap. If structures 10 and 11 are stationary, the rotating foil trap may to some extent be exposed to a varying magnetic field.

Figure 5:
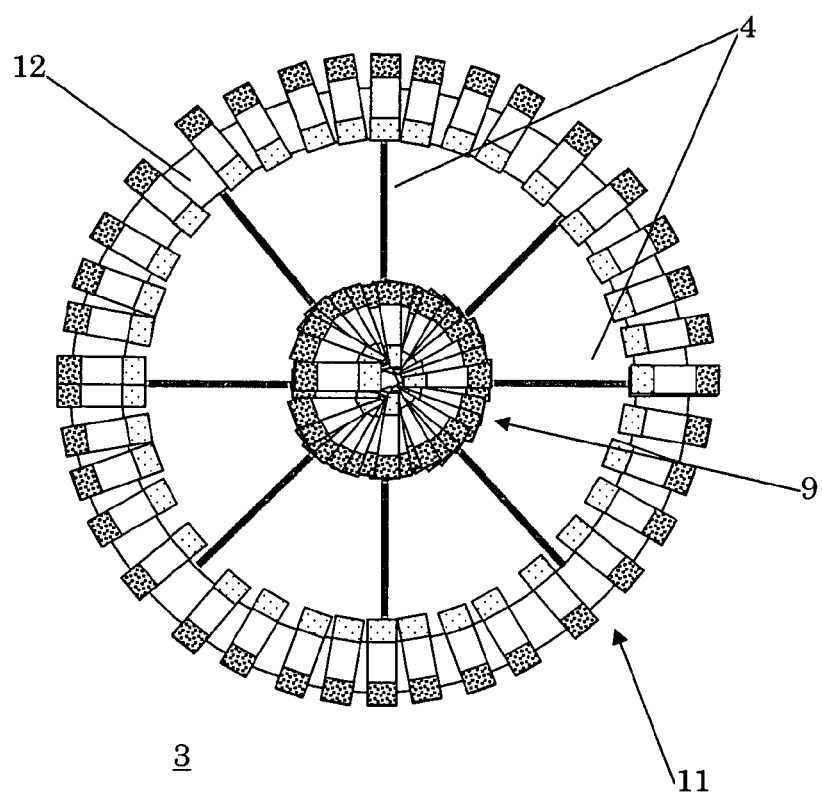
FIG. 5 shows an alternative embodiment of a magnetic structure.

In another embodiment depicted in FIG. 5, a magnetic structure is shown for incorporation into the rotating foil trap 3 or for providing stationary relative thereto. The structure 11 is arranged concentrically relative to an axis of rotation, for example, as a static ring provided around the contamination barrier. The structure comprises a plurality of linear magnets having a magnetic axis aligned and arranged radially relative to a center axis of the contamination barrier. By increasing the number of magnets provided on the rotation axis and provided in a ring 12 concentric thereto at a distance, the magnetic field can be made more rotationally invariant. Typically, the number of magnets on the rotation axis and in the ring 12 may differ; for example, the number of magnets arranged in the ring 12 may be larger. Also, one of the magnetic structures 9, 11, respectively arranged axially or on a ring surrounding the rotational axis may be omitted. In the embodiment illustrated in FIG. 5, the radially aligned magnets may be provided fixed relative to the center axis. Also, the magnets may be provided as a static ring provided around the rotating foil trap 3.

Figure 6:
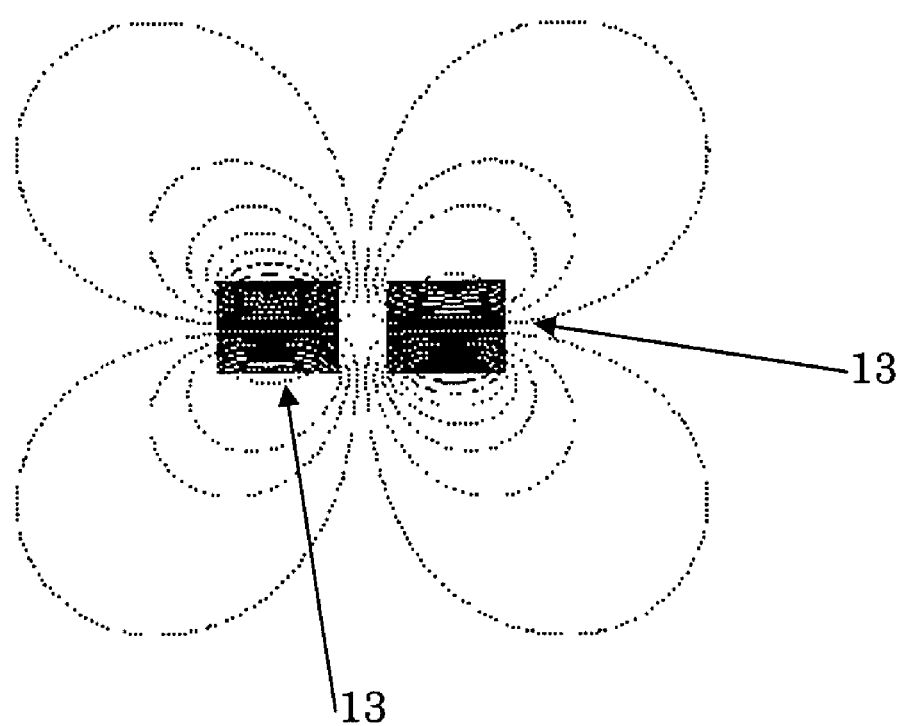
FIG. 6 show a further alternative embodiment of a magnetic structure.

FIG. 6 shows an embodiment wherein a magnetic deflecting field is formed by two opposing linear magnets 13 that have a magnetic axis located on the rotation axis. Thus, in this embodiment, the magnet structure may comprise linear magnets having a magnetic axis oriented concentric with the axis of rotation of the rotating contamination barrier. This magnetic field may be perfectly rotationally symmetric around the rotation axis of the rotational foil trap 3. Similarly, a symmetric magnetic field may be formed using two opposing hollow cylindrical magnets surrounding the rotating foil trap 3, or even using a single magnet instead of two opposing magnets.

Figure 7:
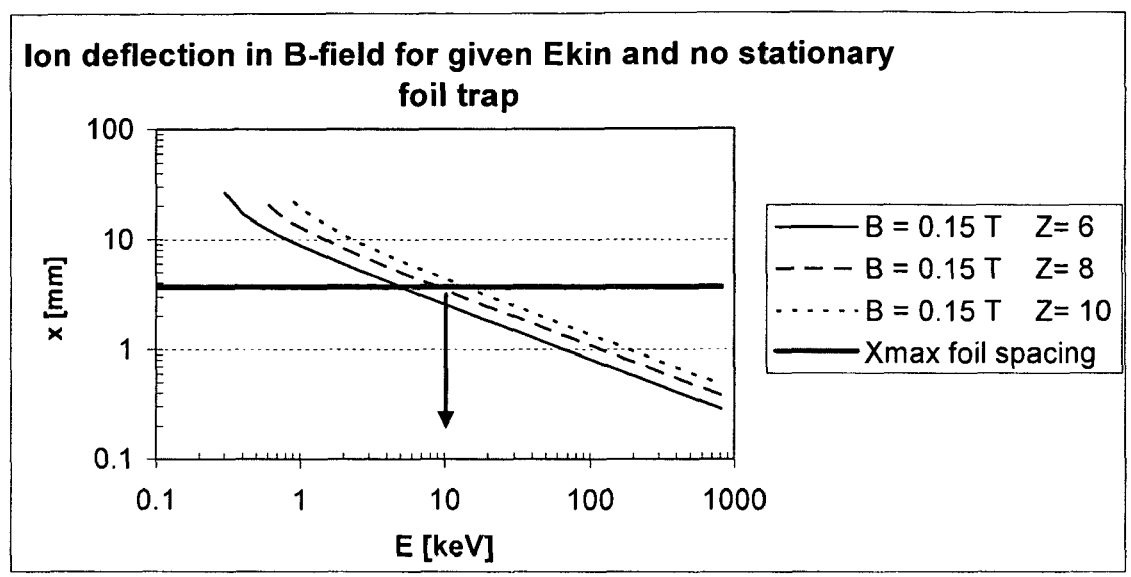
FIG. 7 shows calculation results for a magnetic field strength for an embodiment of the invention that does not include a stationary foil trap.
Figure 8:
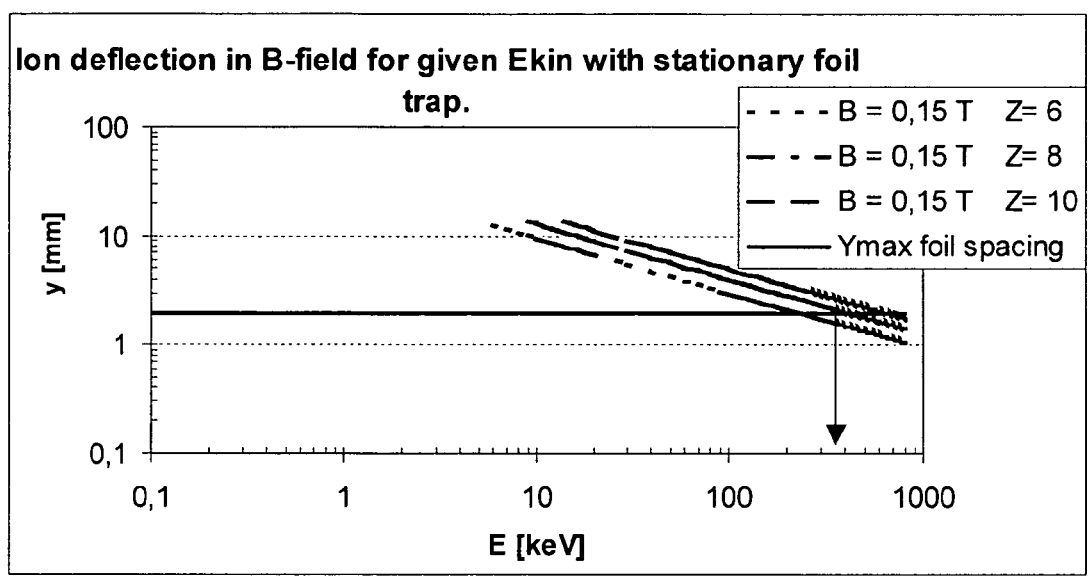
FIG. 8 shows calculation results for a magnetic field strength for an embodiment of the invention that includes a stationary foil trap.

FIG. 7 shows calculation results for magnetic field strengths in an embodiment that includes a rotating foil trap having an axial length of 30 mm; and FIG. 8 shows the results in combination with a stationary foil trap serially aligned respective to the optical axis having a length of 40 mm. A foil spacing was taken to be about 2 mm and an average ionization degree of high energy ions (E/Z=2.5 kV and E/Z=3 kV) is taken to be about 8+. It is shown in FIG. 8 that using a magnetic field strength of about 0.15 T, ions with energy up to $E_{kin}$ of about 400 keV can be stopped using a combined rotating foil trap and stationary foil trap. Without the stationary foil trap, ions with energy up to $E_{kin}$ of about 10 keV can be stopped, as shown in FIG. 7; based on deflection of ions with minimum charge Z=6. In FIG. 7, a vertical deflection x(L) is given for a given magnetic field strength B and ion charge Z. The bold horizontal line indicates the foil trap spacing b. For values of x(L)>b, the ion will have a collision with the foil. In FIG. 8, a vertical deflection y(L) is given for a given magnetic field strength B and ion charge Z. The bold horizontal line indicates the foil trap spacing b. For values of y(L)>b, the ion will have a collision with the foil.

Although the embodiment of FIG. 2 shows a rotating foil trap having a rotation axis directed towards the pinch of the radiation source, that is, in line with an optical axis, the rotation axis may also have a certain angle relative to a line of sight coming from the radiation source.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A debris mitigation system for trapping contaminant material coming from a debris-generating EUV radiation source comprising:
   a contamination barrier constructed and arranged to rotate about an axis; and
   a magnet structure constructed and arranged to provide a magnetic field for deflecting charged debris from the radiation source, said magnet structure being constructed and arranged to provide a magnetic field through said contamination barrier, said magnetic field, when passing through the contamination barrier, being oriented along planes generally coinciding with the axis of rotation of the contamination barrier, the magnetic structure comprising a static ring provided around the contamination barrier.

2. A debris mitigation system according to claim 1, wherein said magnetic field is provided generally invariant for a predetermined rotation of the rotating contamination barrier.

3. A debris mitigation system according to claim 1, wherein said magnetic field is provided generally invariant for any rotation of the rotating contamination barrier.

4. A debris mitigation system according to claim 1, wherein said magnet structure further comprises a plurality of outer magnets arranged to have a magnetic axis arranged perpendicular to the rotation axis of the contamination barrier.

5. A debris mitigation system according to claim 1, wherein said outer magnet structure is rotatable with said contamination barrier.

6. A debris mitigation system according to claim 1, wherein a central magnet structure is provided centrally relative to the axis of rotation, said central magnet structure having magnetic poles opposite to the magnetic poles of the magnet structure.

7. A debris mitigation system according to claim 6, wherein said central magnet structure is provided static relative the contamination barrier.

8. A debris mitigation system according to claim 6, wherein said central magnet structure is rotatable with said the contamination barrier.

9. A debris mitigation system according to claim 6, wherein said central magnet structure comprises a magnet having a magnetic axis oriented concentrically with the axis of rotation of the rotating contamination barrier.

10. A debris mitigation system according to claim 1, wherein said contamination barrier comprises a plurality of foil plates positioned in respective planes which are parallel to a propagation direction of radiation.

11. A debris mitigation system according to claim 1, wherein the plates are oriented parallel to said magnetic field.

12. A debris mitigation system according to claim 11, wherein the magnetic field is provided to have magnetic field lines traversing the plates in axial direction, relative to the axis of rotation.

13. A debris mitigation system according to claim 11, wherein the magnetic field is provided to have magnetic field lines traversing the plates in radial direction, relative to the axis of rotation.

14. A debris mitigation system according to claim 1, further comprising a discharge produced or a laser induced plasma source.

15. A debris mitigation system according to claim 14, wherein said plasma source comprises tin, lithium, or xenon.

16. A debris mitigation system according to claim 1, further comprising a collector element.

17. A debris mitigation system according to claim 16, wherein said collector element is cylinder symmetric to the axis of rotation of the contamination barrier and comprises concentrically curved reflective surfaces.

18. A debris mitigation system according to claim 17, wherein said reflective surfaces are stacked at a distance ranging between about 2 and 7 cm.

19. A lithographic apparatus comprising:
   a patterning device constructed and arranged to pattern a beam of radiation;
   a projection system constructed and arranged to project the patterned beam of radiation onto a substrate; and
   a debris mitigation system constructed and arranged to trap contaminant material generated by a debris-generating EUV radiation source, the debris mitigation system comprising
   a contamination barrier constructed and arranged to rotate about an axis; and
   a magnet structure constructed and arranged to provide a magnetic field for deflecting charged debris from the radiation source, said magnet structure being constructed and arranged to provide a magnetic field through said contamination barrier, said magnetic field, when passing through the contamination barrier, being oriented along planes generally coinciding with the axis of rotation of the contamination barrier, the magnetic structure comprising a static ring provided around the contamination barrier.

* * * * *